(12) United States Patent
Shin et al.

(10) Patent No.: US 11,967,567 B2
(45) Date of Patent: *Apr. 23, 2024

(54) SEMICONDUCTOR PACKAGE WITH EMI SHIELD AND FABRICATING METHOD THEREOF

(71) Applicant: Amkor Technology Singapore Holding Pte. Ltd., Singapore (SG)

(72) Inventors: Doo Soub Shin, Seoul (KR); Tae Yong Lee, Gyeonggi-do (KR); Kyoung Yeon Lee, Seoul (KR); Sung Gyu Kim, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,325

(22) Filed: Apr. 24, 2023

(65) Prior Publication Data

US 2023/0411303 A1  Dec. 21, 2023

Related U.S. Application Data

(63) Continuation of application No. 17/384,942, filed on Jul. 26, 2021, now Pat. No. 11,637,073, which is a (Continued)

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/565* (2013.01);
(Continued)

(58) Field of Classification Search
CPC ... H01L 21/565; H01L 23/3128; H01L 24/16; H01L 24/48; H01L 24/73;
(Continued)

(56) References Cited

U.S. PATENT DOCUMENTS 7,851,894 B1   12/2010   Scanlan
8,093,691 B1   1/2012    Fuentes et al.
(Continued)

FOREIGN PATENT DOCUMENTS

CN   106169445   11/2016
KR   101674322   11/2016
TW   I397964     8/2012

OTHER PUBLICATIONS

Taiwanese Office Letter dated Nov. 24, 2021 for Appln. No. 106144191, 8 pages.
(Continued)

*Primary Examiner* — Matthew E. Gordon
(74) *Attorney, Agent, or Firm* — McAndrews, Held & Malloy, Ltd.

(57) ABSTRACT

A semiconductor device with EMI shield and a fabricating method thereof are provided. In one embodiment, the semiconductor device includes EMI shield on all six surfaces of the semiconductor device without the use of a discrete EMI lid.

20 Claims, 14 Drawing Sheets

Related U.S. Application Data continuation of application No. 16/777,519, filed on Jan. 30, 2020, now Pat. No. 11,075,170, which is a continuation of application No. 15/404,242, filed on Jan. 12, 2017, now Pat. No. 10,553,542.

(51) Int. Cl.
| | | |
|---|---|---|
| *H01L 21/56* | (2006.01) | |
| *H01L 23/00* | (2006.01) | |
| *H01L 23/31* | (2006.01) | |
| *H01L 23/498* | (2006.01) | |
| *H01L 23/538* | (2006.01) | |
| *H01L 25/065* | (2023.01) | |

(52) U.S. Cl.
CPC .... *H01L 23/3128* (2013.01); *H01L 23/49816* (2013.01); *H01L 23/5383* (2013.01); *H01L 24/16* (2013.01); *H01L 24/48* (2013.01); *H01L 24/73* (2013.01); *H01L 25/0652* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/06517* (2013.01); *H01L 2225/06558* (2013.01); *H01L 2924/15192* (2013.01); *H01L 2924/15311* (2013.01); *H01L 2924/3025* (2013.01)

(58) Field of Classification Search
CPC . H01L 2224/16227; H01L 2224/32225; H01L 2224/48091; H01L 2224/73265
USPC ........................................................ 257/659
See application file for complete search history.

(56) References Cited

U.S. PATENT DOCUMENTS

| | | | |
|---|---|---|---|
| 8,420,437 B1* | 4/2013 | Fan | H01L 23/552 |
| | | | 257/419 |
| 9,343,427 B2 | 5/2016 | Kim et al. | |
| 9,935,083 B2 | 4/2018 | Lee et al. | |
| 2009/0140419 A1 | 6/2009 | Rhyner | |
| 2012/0008288 A1* | 1/2012 | Tsukamoto | H05K 9/0037 |
| | | | 361/736 |
| 2012/0217642 A1 | 8/2012 | Sun et al. | |
| 2012/0228751 A1* | 9/2012 | Song | H01L 24/06 |
| | | | 438/109 |
| 2013/0114235 A1 | 5/2013 | Leal | |
| 2013/0223041 A1* | 8/2013 | Arnold | H01L 23/552 |
| | | | 29/874 |
| 2015/0249058 A1* | 9/2015 | Cowley | H01L 23/552 |
| | | | 257/532 |
| 2016/0093576 A1* | 3/2016 | Chiu | H01L 21/4853 |
| | | | 257/659 |
| 2016/0118337 A1* | 4/2016 | Yoon | H01L 24/82 |
| | | | 257/774 |
| 2016/0218049 A1 | 7/2016 | Lin et al. | |
| 2016/0270213 A1* | 9/2016 | Salehi | B33Y 80/00 |
| 2016/0351509 A1 | 12/2016 | Dang | |
| 2017/0018531 A1 | 1/2017 | Lin et al. | |
| 2017/0118877 A1 | 4/2017 | Kumbhat | |
| 2018/0061808 A1* | 3/2018 | Wang | H01L 24/19 |
| 2018/0096950 A1* | 4/2018 | Chen | H01L 21/4853 |
| 2018/0102345 A1 | 4/2018 | Lin | |

OTHER PUBLICATIONS

Chinese Office Letter dated Nov. 4, 2022 for Appln. No. 201810003422.2, 16 pages.

Taiwanese Office Letter dated Feb. 19, 2024 for Appln. No. 111136204, 8 pages.

* cited by examiner

SEMICONDUCTOR PACKAGE WITH EMI SHIELD AND FABRICATING METHOD THEREOF

BACKGROUND

Certain embodiments of the disclosure relate to a semiconductor package with electromagnetic interference (EMI) shield and a fabricating method thereof.

A semiconductor package may emit EMI that may interfere with operation of other semiconductor packages. Accordingly, various semiconductor packages may comprise EMI shield to help reduce EMI from being emitted and to block EMI from other sources.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

The present disclosure provides a semiconductor package with EMI shield and a fabricating method thereof.

The above and other objects of the present disclosure will be described in or be apparent from the following description of the preferred embodiments.

DETAILED DESCRIPTION

Figure 1:
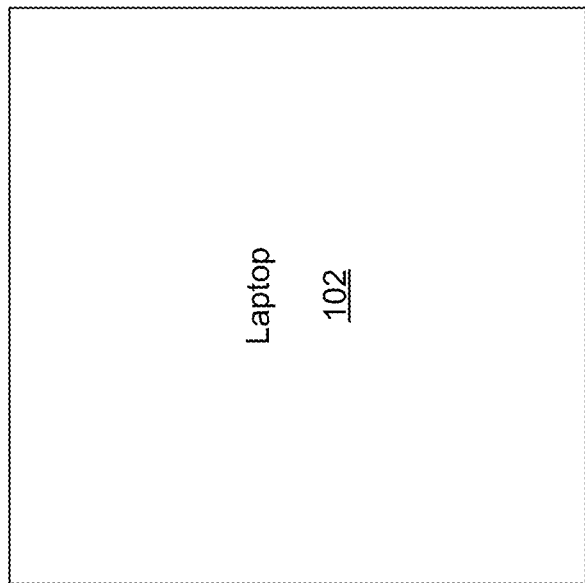
FIG. 1 is an illustration of devices that may interfere with each other.
Figure 1:
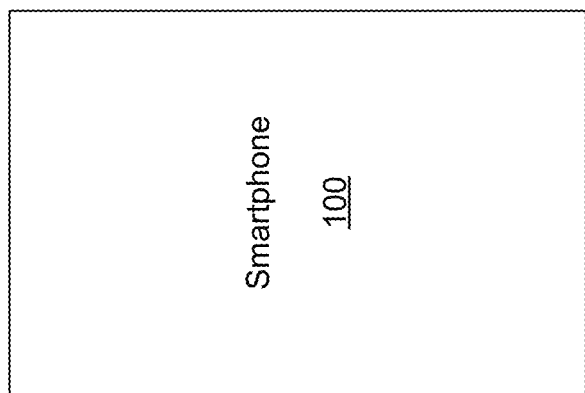

Various example embodiments of the disclosure will be described in detail with reference to the accompanying drawings such that they can be made and used by those skilled in the art.

Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

The terminology used here is for the purpose of describing particular embodiments only and is not intended to limit the disclosure. In the drawings, the thickness of layers and regions may be exaggerated for clarity. Like reference numerals refer to like elements throughout.

As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z." As utilized herein, the term "exemplary" means serving as a non-limiting example, instance, or illustration. As utilized herein, the terms "e.g." and "for example" set off lists of one or more non-limiting examples, instances, or illustrations.

Also, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof.

In addition, it will be understood that when an element A is referred to as being "connected to" (or "coupled to") an element B, the element A can be directly connected to (or coupled to) the element B, or an intervening element C may be present between the elements A and B so that the element A can be indirectly connected to the element B.

Furthermore, although the terms first, second, etc. may be used to describe various members, elements, regions, layers and/or sections, these members, elements, regions, layers and/or sections should not be limited by these terms. These terms are only used to distinguish one member, element, region, layer, and/or section from another. Thus, for example, a first member, a first element, a first region, a first layer, and/or a first section discussed below could be termed a second member, a second element, a second region, a second layer, and/or a second section without departing from the teachings of the present disclosure.

Spatially relative terms, such as "upper," "lower," "side," and the like, may be used for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned upside-down, elements described as "below" or "beneath" other elements or features would then be oriented "above" the other elements or features. Thus, the exemplary term "below" can encompass both an orientation of above and below.

For ease of reference, a semiconductor device that is shielded on all sides in accordance with an embodiment of the disclosure may be referred to as a semiconductor package. However, the use of this term "semiconductor package" does not limit in any way the various embodiments of the disclosure.

The drawings and descriptions may leave out some parts of a semiconductor device/package in order to make the description/explanation clearer. Accordingly, it should be understood that various embodiments of the disclosure may include specific parts (for example, through vias, one or more layers of electrical connections, one or more layers of dielectrics/passivation/insulation, underfills, etc.) that are not described here.

FIG. 1 is an illustration of various devices that may interfere with each other. Referring to FIG. 1, there is shown a smartphone 100 and a laptop 102. In normal operation, the smartphone 100 and the laptop 102 may communicate wirelessly with each other. However, each of these devices may also emit electronic signals (noise) that are not useful to the other device. In some cases, the noise may be strong enough to interfere with operation of another device. Some entities may also want to reduce electronic signals emitted by a device for security purposes. For example, electronic signals emitted by a laptop may be picked up by a nearby party to recreate display images shown on the laptop.

To reduce noise emitted by a device, and to reduce susceptibility to noise from another device, a device manufacturer may provide electromagnetic interference (EMI) shielding for the device. The EMI shield may be at a system level such as for the entire smartphone 100 or the laptop 102, at a chip or electronic component level for a semiconductor package or semiconductor dies, or at different levels in between.

Accordingly, an exemplary embodiment of the disclosure may be a semiconductor package comprising one or more semiconductor devices, an electromagnetic interference (EMI) shield on all external surfaces of the semiconductor package, and an opening in which an electrical interconnect is placed to form electrical contact with a pad.

Another exemplary embodiment of the disclosure may be a method for shielding a semiconductor device, where the method comprises attaching, to the semiconductor device comprising a top encapsulant and a bottom encapsulant, a first carrier to a bottom surface of the bottom encapsulant, for example when the semiconductor device does not have a first carrier already attached. The method may comprise forming an external electromagnetic interference (EMI) shield on all external surfaces of the semiconductor device that are not covered by the first carrier. A second carrier may be attached to a top surface of the top encapsulant and the first carrier may be removed from the bottom encapsulant of the semiconductor device. An external bottom EMI shield may then be formed on a bottom surface of the bottom encapsulant.

A further exemplary embodiment of the disclosure may be a semiconductor package comprising semiconductor devices, where the semiconductor package also comprises a top encapsulant and a bottom encapsulant, and the top encapsulant may encapsulate at least two of the semiconductor devices. An electromagnetic interference (EMI) shield may be on all external surfaces of the semiconductor package, and an internal EMI shield may be between two of the semiconductor devices. Furthermore, an electrical interconnect may be electrically connected to at least one of the semiconductor devices via a pad, where the pad is located in the bottom encapsulant.

Figure 2:
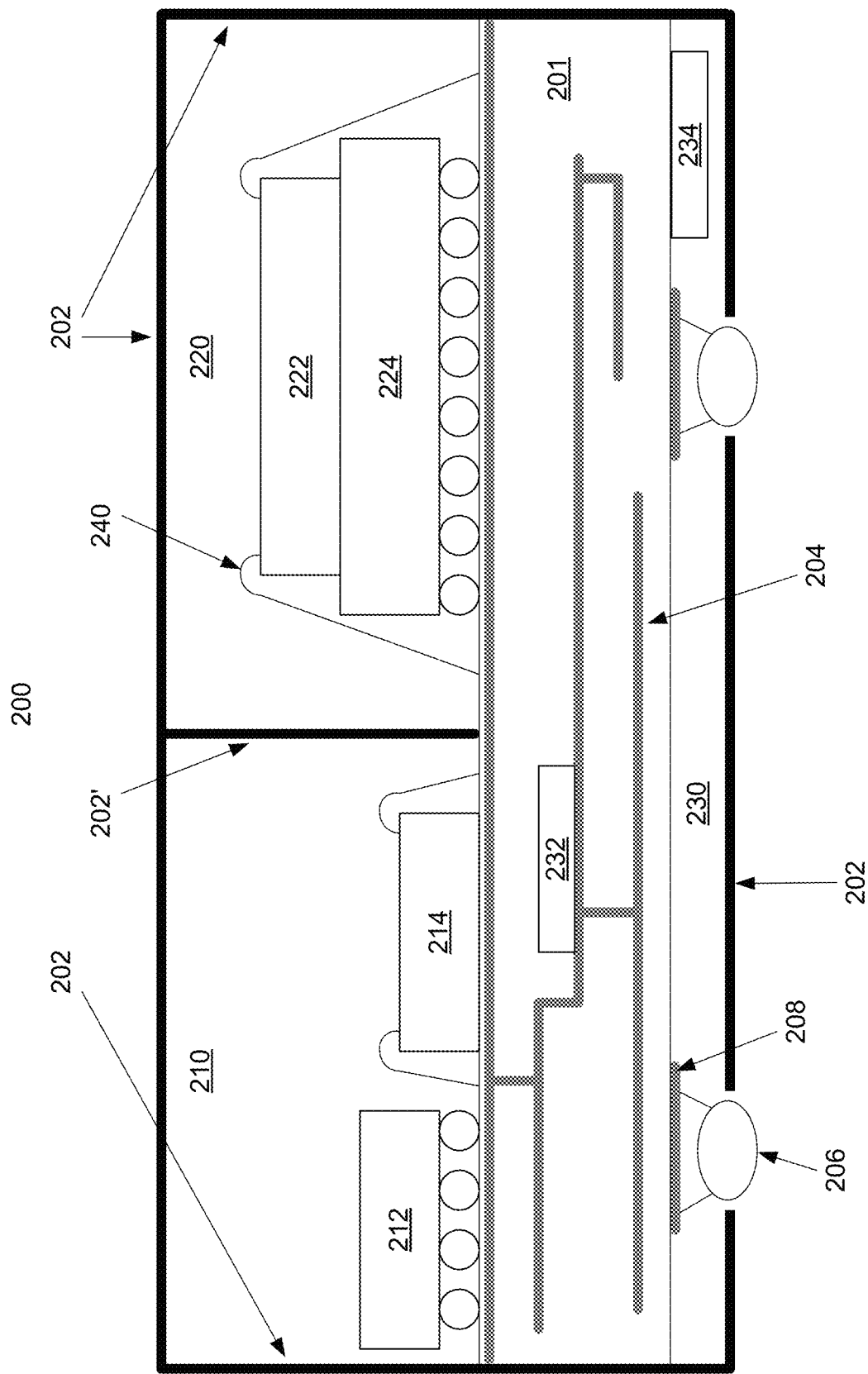
FIG. 2 is a cross-sectional view illustrating a semiconductor package according to an exemplary embodiment of the present disclosure.

FIG. 2 is a cross-sectional view illustrating a semiconductor package according to an exemplary embodiment of the present disclosure. Referring to FIG. 2, there is shown a semiconductor package 200 that is EMI shielded on all six of its sides. The semiconductor package 200 comprises semiconductor dies 212, 214 covered by encapsulant 210 and semiconductor dies 222, 224 covered by encapsulant 220. The semiconductor dies 212, 214, 222, and 224 may be electrically connected to various conductive traces 204 (vias, redistribution layers (RDLs), pads, wires, electrical interconnects, etc.). The conductive traces 204 may be embedded, for example, in a substrate 201 (e.g., a cored or coreless substrate, printed circuit board, built-up signal distribution structure comprising one or more dielectric layers and/or conductive layers, etc.). An electronic device 232 may be connected to the conductive traces 204, which may be, for example, partially or fully embedded in the substrate 201. The conductive traces 204 and the electronic device 232 may be considered to be part of, for example, the substrate 201. An electronic device 234 may also be coupled to a lower surface of the substrate 201. Each of the electronic devices 232 and 234 may be a passive device, an active device, or a combination of passive and active devices.

The electrical connectors 206 (e.g., interconnection structures, such as conductive balls or bumps, conductive posts or pillars, etc.) may be coupled to the pads 208 on a lower side of the substrate 201. The electronic device 234, the electrical connectors 206, and the pads 208 may be covered by an encapsulant 230.

While the term "encapsulant" is used, it should be understood that any similar structure that covers or encapsulates the various semiconductor dies 212, 214, 222, and 224, the electronic devices 232 and 234, the conductive traces 204, the pads 208, etc. may also be referred to as "encapsulant." Accordingly, molding may be an example of an encapsulant. An encapsulant may comprise an encapsulant material/layer, insulating material/layer, passivation material/layer, dielectric material/layer, etc.

Some examples of encapsulant material may be pre-preg, a build-up film, a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.

The inner shield 202' may act to block electromagnetic signals from the devices covered by the encapsulant 210 to the devices covered by the encapsulant 220, and vice versa. The outer shield 202 on the top, the bottom, and the four sides of the semiconductor package 200 may act to block electromagnetic signals from the semiconductor package 200 from propagating outside the semiconductor package 200, as well as blocking electromagnetic signals from other semiconductor devices (not shown) from entering the semiconductor package 200. Since the semiconductor package 200 is EMI shielded on all six of its sides except for small areas at the bottom where the electrical connectors 206 are located, there should be minimal EMI to other electronic devices due to the semiconductor package 200. Similarly, there may be minimal EMI to the semiconductor package 200 due to other electronic devices external to the semiconductor package 200.

While semiconductor dies were specifically mentioned, various embodiments of the disclosure may also comprise blocking EMI to/from passive devices in the semiconductor package 200 such as, for example, resistors, capacitors, and inductors, as well as from signal traces. Additionally, a semiconductor die may be replaced with a semiconductor device that may comprise semiconductor die(s), discrete active device(s), and/or passive device(s).

FIGS. 3-9 are cross-sectional views illustrating various stages in shielding a semiconductor device according to an embodiment of the present disclosure.

Figure 9:
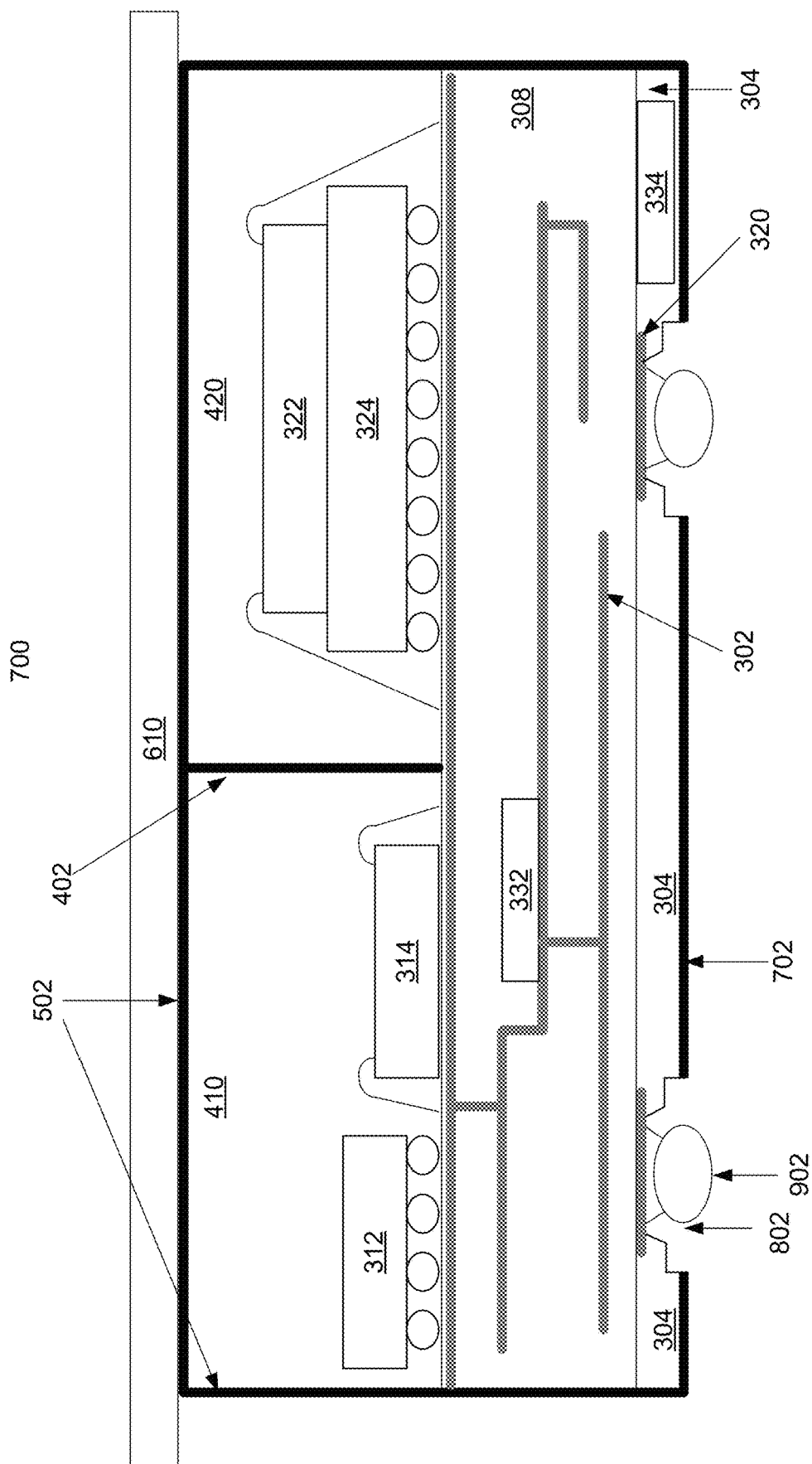
Figure 10:
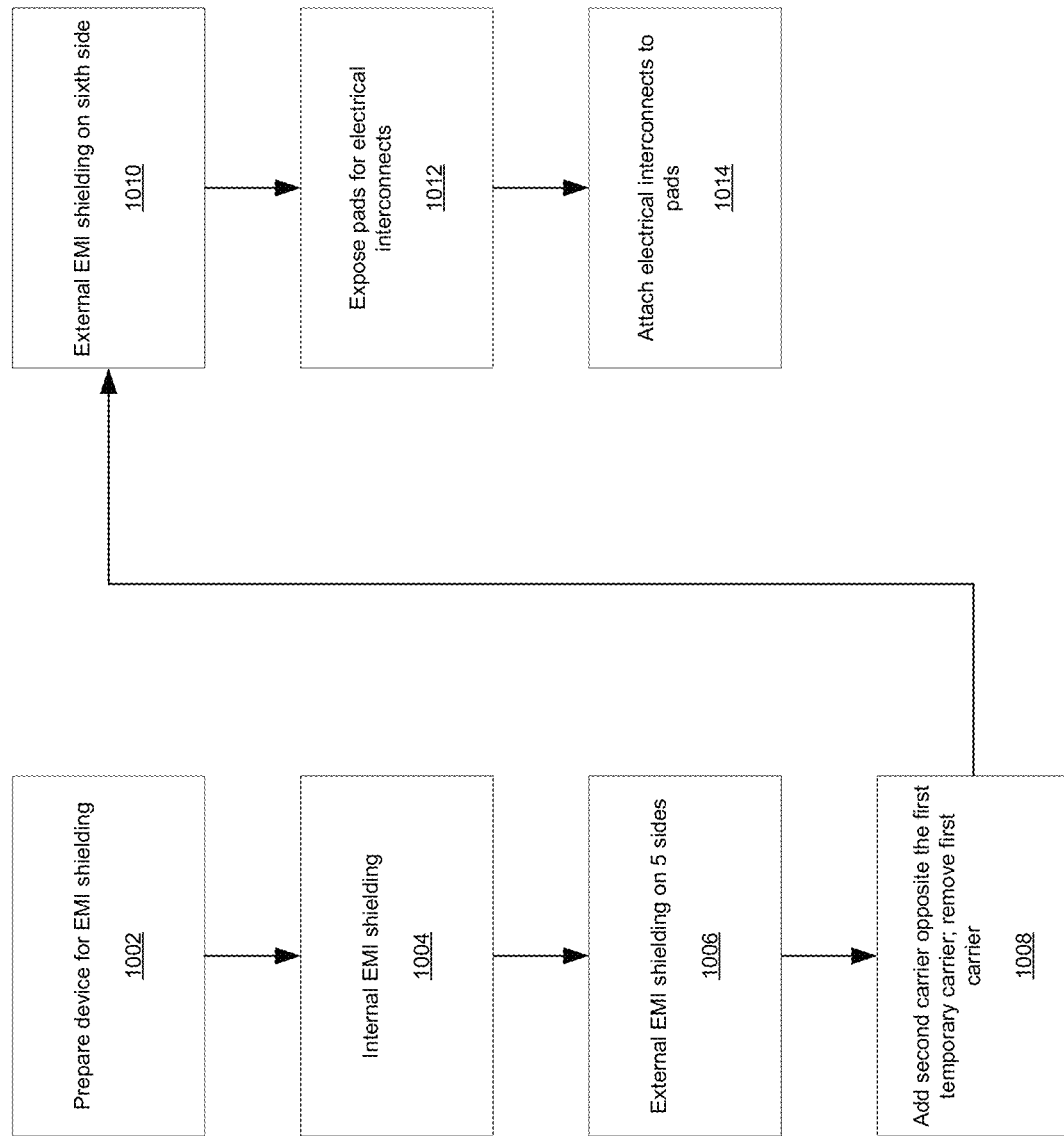
FIG. 10 is an example of a flow diagram for shielding a semiconductor device according to an exemplary embodiment of the present disclosure.

FIG. 10 is an example flow diagram for shielding a semiconductor device according to an exemplary embodiment of the present disclosure. FIGS. 3-9 will be explained in more detail with respect to the exemplary flow diagram of FIG. 10.

Figure 3:
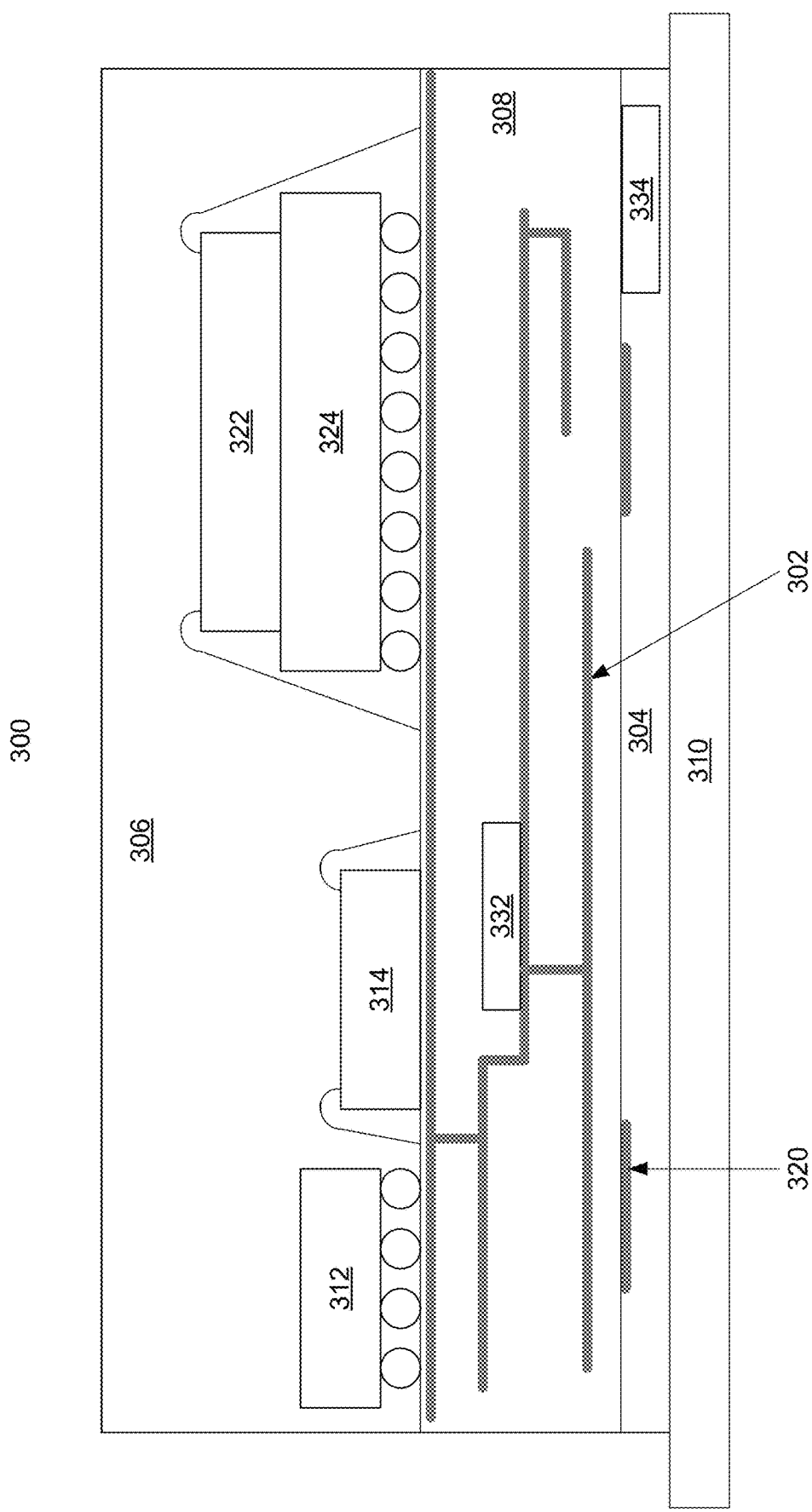
FIGS. 3-9 are cross-sectional views illustrating various stages in shielding a semiconductor device according to an exemplary embodiment of the present disclosure.

At 1002, a semiconductor device 300 of FIG. 3 comprising a double-side molded device may be prepared for EMI shielding. Part of the preparation may be, for example, attaching the semiconductor device 300 to a carrier 310 if a carrier is not present. The carrier 310 may comprise a layer of material that is attached to the semiconductor device 300 to allow various operations and manipulations to be performed on the semiconductor device 300. The carrier 310 may comprise, for example, a metal plate, glass plate, semiconductor wafer or panel, etc. The carrier 310 may be attached to the semiconductor device 300 in any of a variety of manners, for example utilizing an adhesive (e.g., a thermally releasable adhesive, a chemically releasable adhesive, an ultraviolet light releasable adhesive, etc.), utilizing vacuum pressure, utilizing mechanical clamping, etc.).

The semiconductor device 300 may comprise, for example, semiconductor dies 312, 314, 322, and 324, and electronic devices 332 and 334 that may be passive devices or active devices, or a combination of passive and active devices. The semiconductor device 300 may also comprise conductive traces 302 (vias, RDLs, pads, wires, electrical interconnects, etc.). The conductive traces 302 may be embedded, for example, in a substrate 308. The semiconductor dies 312, 314, 322, and 324 may be covered by an encapsulant 306 (e.g., an upper encapsulant), and the conductive traces 302 and the electronic device 332 may be embedded in the substrate 308. The electronic device 334 may be covered by an encapsulant 304 (e.g., a lower encapsulant). Note that the encapsulant 306 and the encapsulant 304 may be, but need not be, formed of a same material.

While the term "encapsulant" is used, it should be understood that any similar structure that covers or encapsulates the various semiconductor dies 312, 314, 322, and 324, and the electronic device 334, etc. may also be referred to as "encapsulant." Accordingly, an encapsulant may be any suitable encapsulant material/layer, insulating material/layer, passivation material/layer, dielectric material/layer, etc.

Some examples of encapsulant material may be pre-preg, a build-up film, a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, and the like.

At block 1004, an internal shield is formed. This can be seen in the semiconductor device 300 of FIG. 4A where a space 401 is formed in the encapsulant 306, and the semiconductor device 300 of FIG. 4B where an internal shield 402 is formed in the space 401. The space 401 shown in FIG. 4A may be formed by removing a portion of the encapsulant 306 to form the separated encapsulants 410 and 420, where encapsulant 410 covers the semiconductor dies 312, 314 and encapsulant 420 covers the semiconductor dies 322, 324. The removal of a portion of the encapsulant 306 to form the space 401 may use any appropriate method, such as, for example, using a mechanical process such as sawing, using a chemical process, using a laser, using a jet of fluid or gas, etc. The space 401 may, for example extend completely between opposite sides of the device 300, but need not. The space 401 may, for example, be characterized as a gap, a trench, a hole, etc.

Figure 4A:
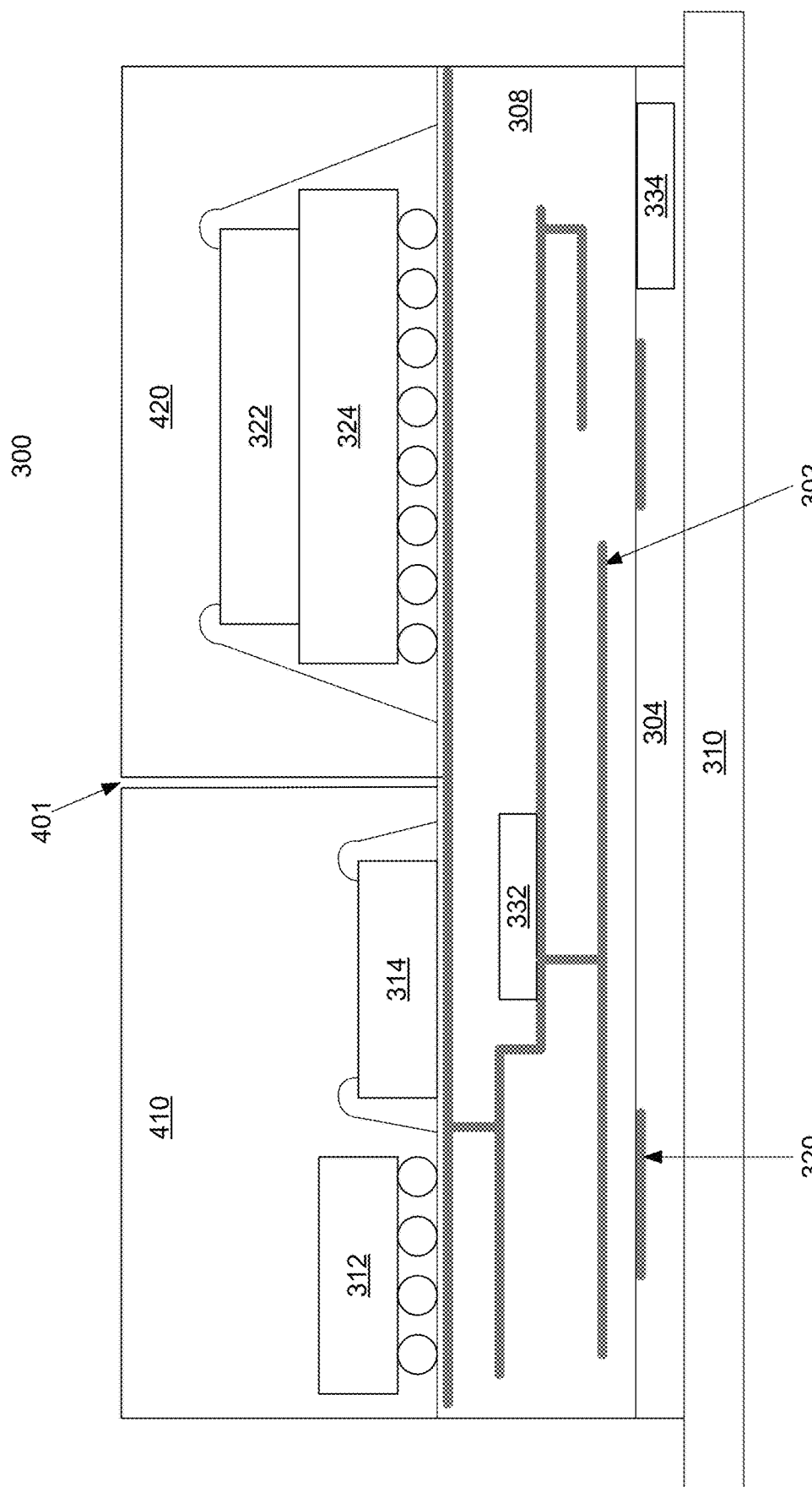
Figure 4B:
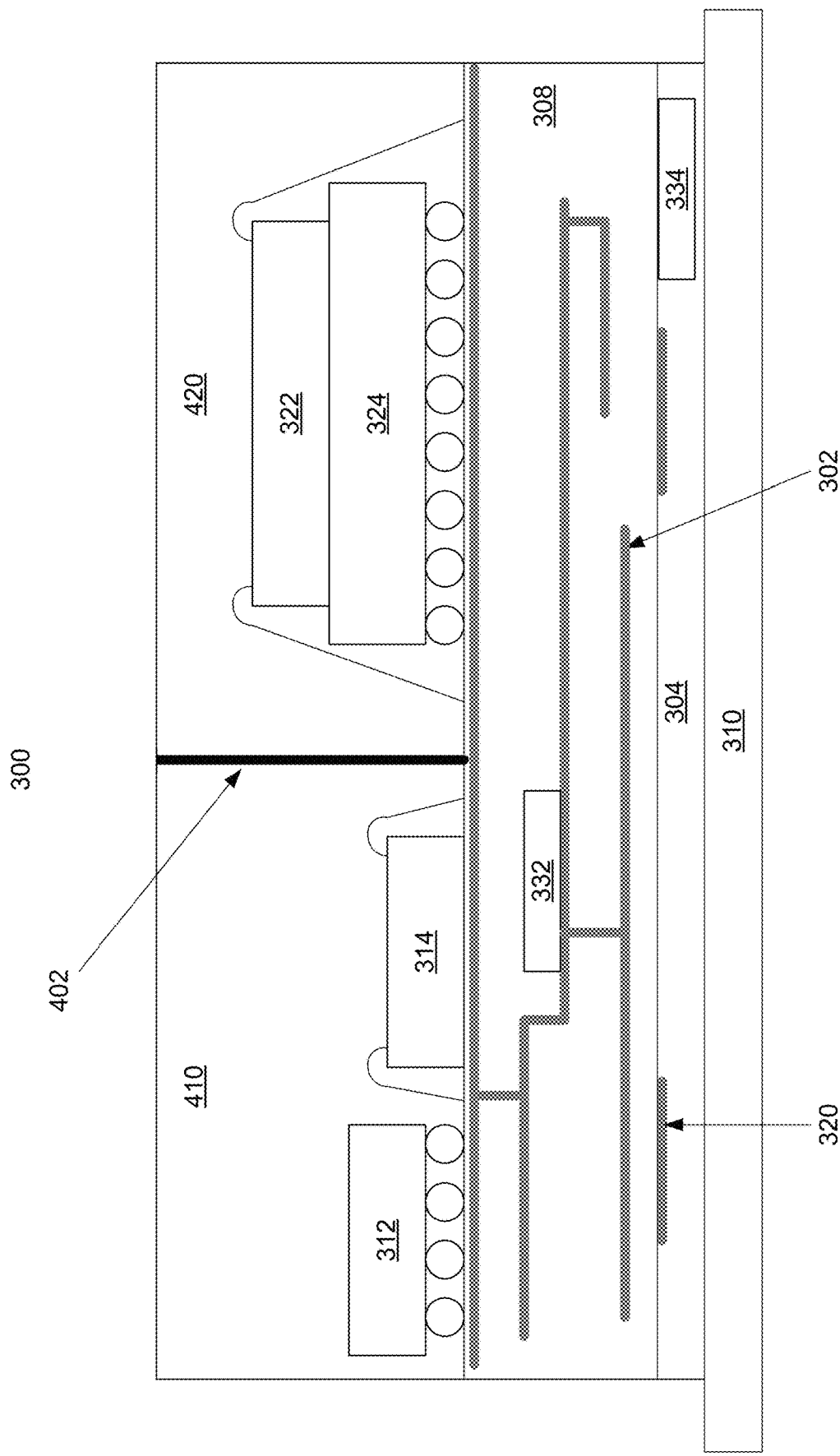

As shown in FIG. 4B, the space 401 may be filled with appropriate material for EMI shielding to form the internal shield 402. The internal shield 402 may be appropriate material that may block at least some EMI signals. For example, the internal shield 402 may comprise one or more suitable shielding materials such as copper, silver, gold, aluminum, tin, brass, bronze, steel, superpermalloy, mumetal, graphite, composite material, etc.

The material for the internal shield 402 may be deposited using a suitable deposition process depending on the dimensions of the internal shield 402 and/or the characteristics of the material, such as, for example, sputtering, electroplating, electroless plating, vacuum deposition, dipping, printing, injecting, flooding, etc.

Figure 5:
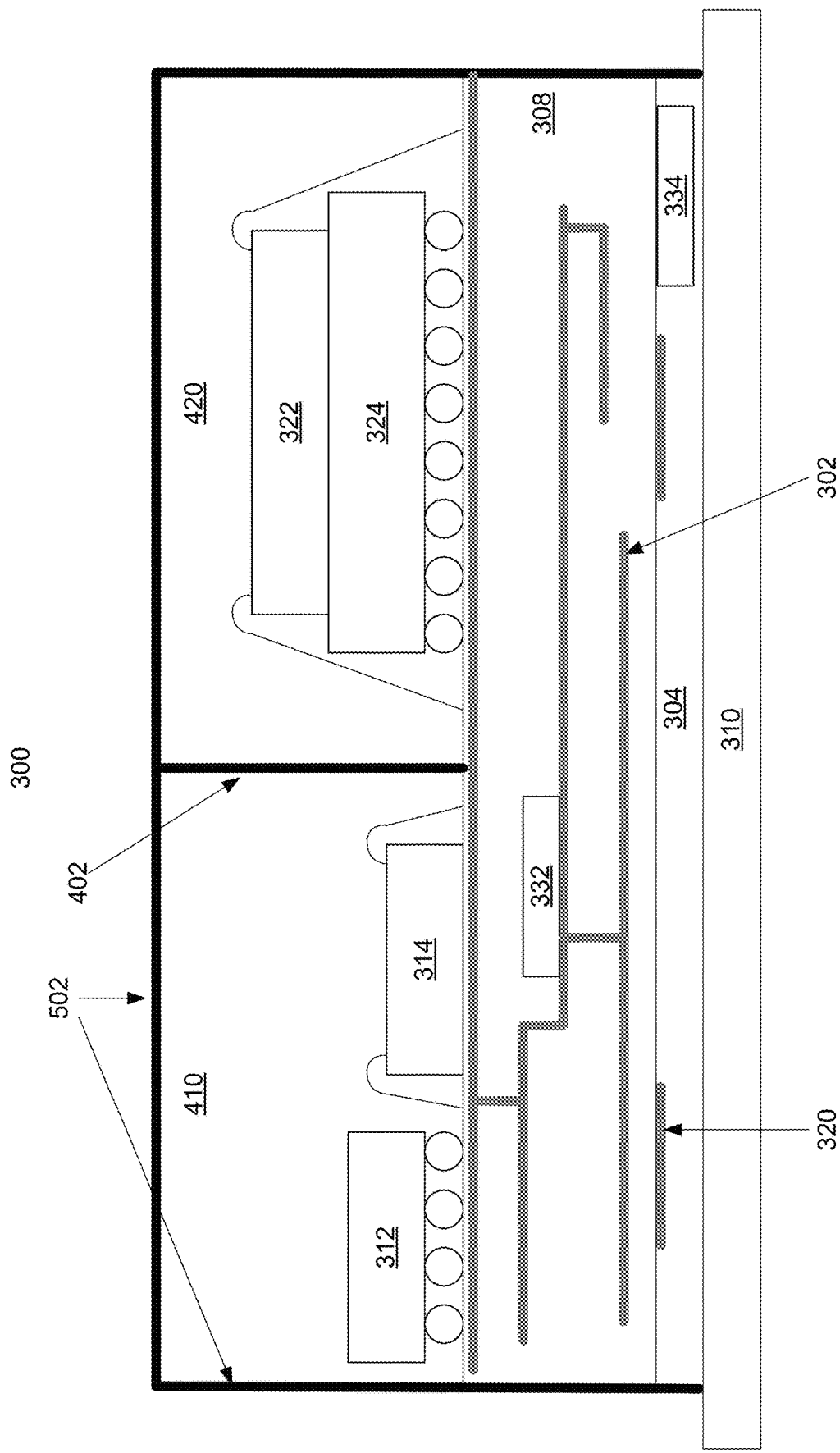

At 1006, external EMI shielding is provided at five sides of the semiconductor device. For example, the semiconductor device 300 of FIG. 5 is shown with the addition of external shield 502 on the five sides that are exposed (i.e., not covered by the carrier 310). The external shield 502 may be formed of one or more suitable EMI shielding materials such as, for example, copper, silver, gold, aluminum, tin, brass, bronze, steel, superpermalloy, mumetal, graphite, composite material, etc. The material for the external shield 502 may be deposited using a suitable deposition process such as, for example, sputtering, electroplating, electroless plating, vacuum deposition, dipping, printing, injection, flooding, etc. Note that the external shield 502 may be, but need not be, formed of a same material as the internal shield 402. Also note that block 1006 and the forming of the shielding at block 1004 may be performed simultaneously utilizing a same forming (or deposition) process.

Figure 6A:
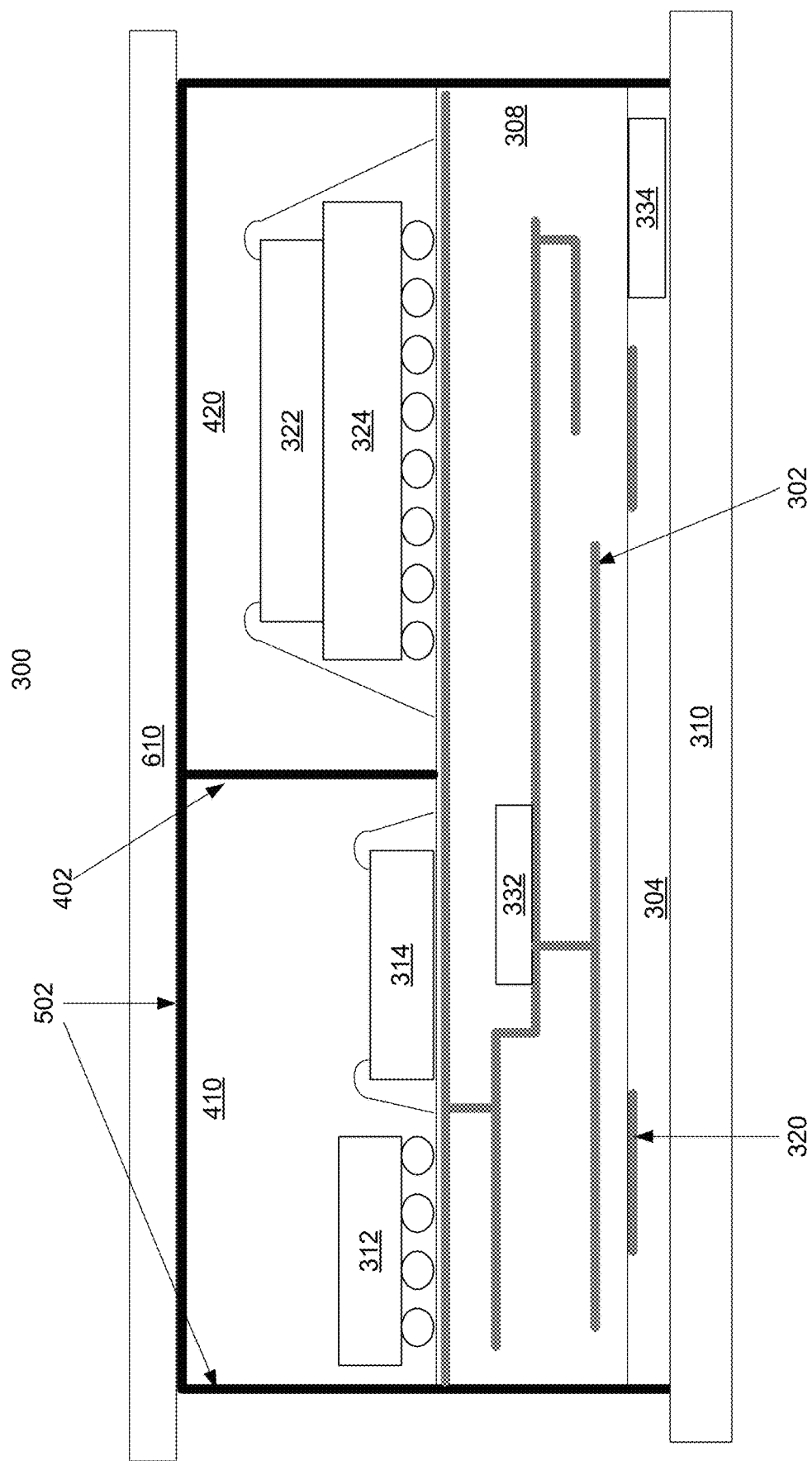
Figure 6B:
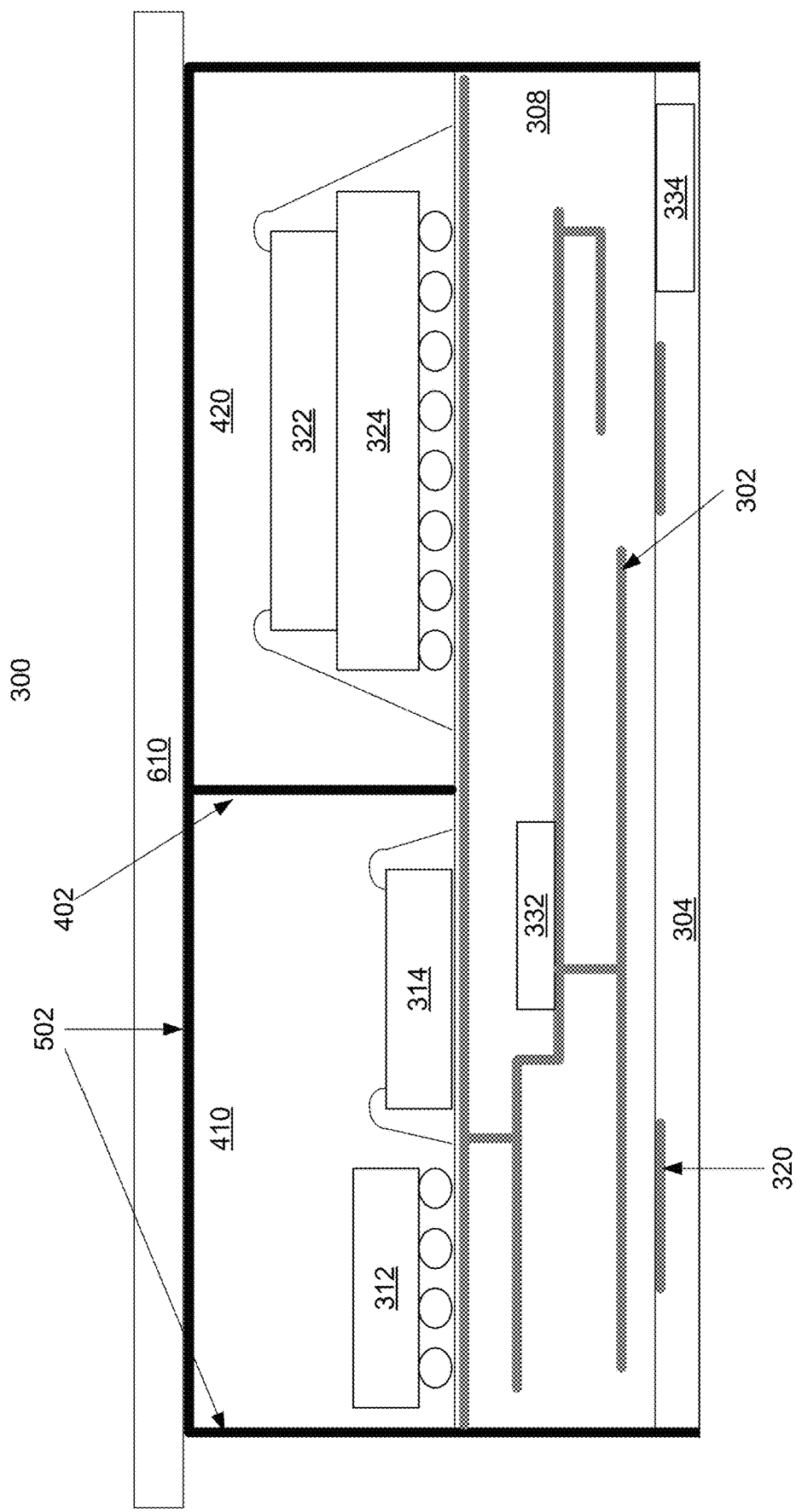

At 1008, a carrier 610 is added on top of the semiconductor device 300, as shown in FIG. 6A, and the carrier 310 is removed from the bottom of the semiconductor device 300, as shown in FIG. 6B. Referring to FIG. 6A, the carrier 610, which may be, for example, similar to the carrier 310, may be attached to the top of the semiconductor device 300. The carrier 610 may be, for example, attached to the top of the semiconductor device 300 in a manner similar to the manner in which the carrier 310 was attached to the bottom of the semiconductor device 300, or may be attached utilizing another suitable method.

Referring to FIG. 6B, after attaching the carrier 610, the carrier 310 may be removed using any of the various methods that may be suitable. For example, the carrier 310 may be pulled or peeled off; the adhesive (if used) may be dissolved or thermally released or UV released; the carrier 310 may be etched off or removed using laser, abrasion or grinding, jets of fluid or gas, etc. Accordingly, the bottom surface of the semiconductor device 300 may now be exposed.

Figure 7:
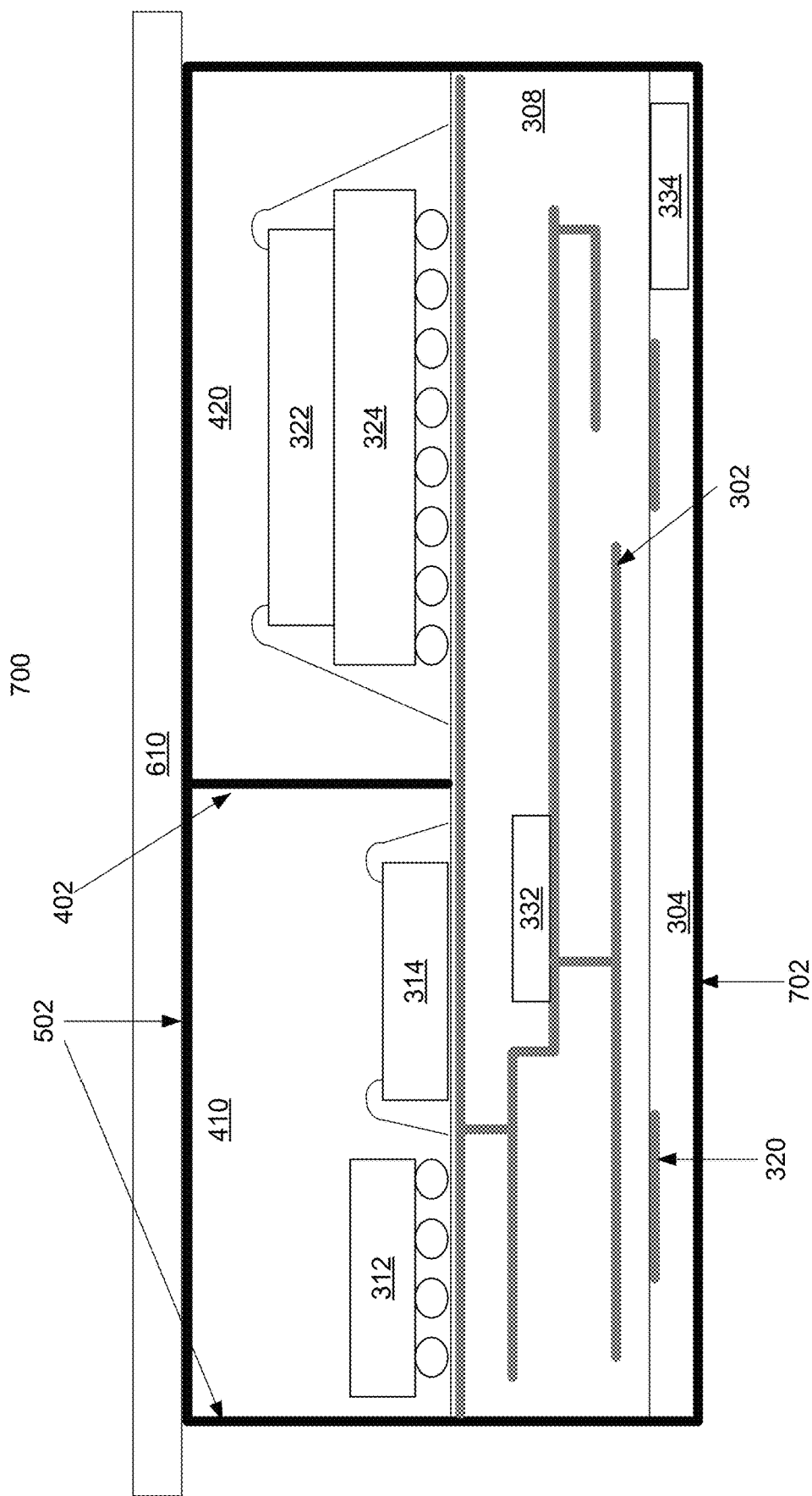

At 1010, as shown in FIG. 7, the bottom surface may be deposited with EMI shielding material as, for example, the top surface and/or the vertical side surfaces were deposited with EMI shielding material. The semiconductor device 300 has now been processed to the semiconductor package 700 where all sides are EMI shielded. The EMI shielding material for the external bottom shield 702 for the bottom surface may be similar to the EMI shielding material for the external shield 502, although it need not necessarily be the same material. The process of forming the external bottom shield 702 may also be similar to the process of forming the external shield 502 for the top surface of the semiconductor package 700, although it need not be the same method. Note that the orientation of the device 700 as illustrated in FIG. 7 is kept consistent with other figures for illustrative clarity. During the forming of the external bottom shield 702 or during any processing step discussed herein, the orientation of the device 700 or any example device shown herein may be changed.

Figure 8A:
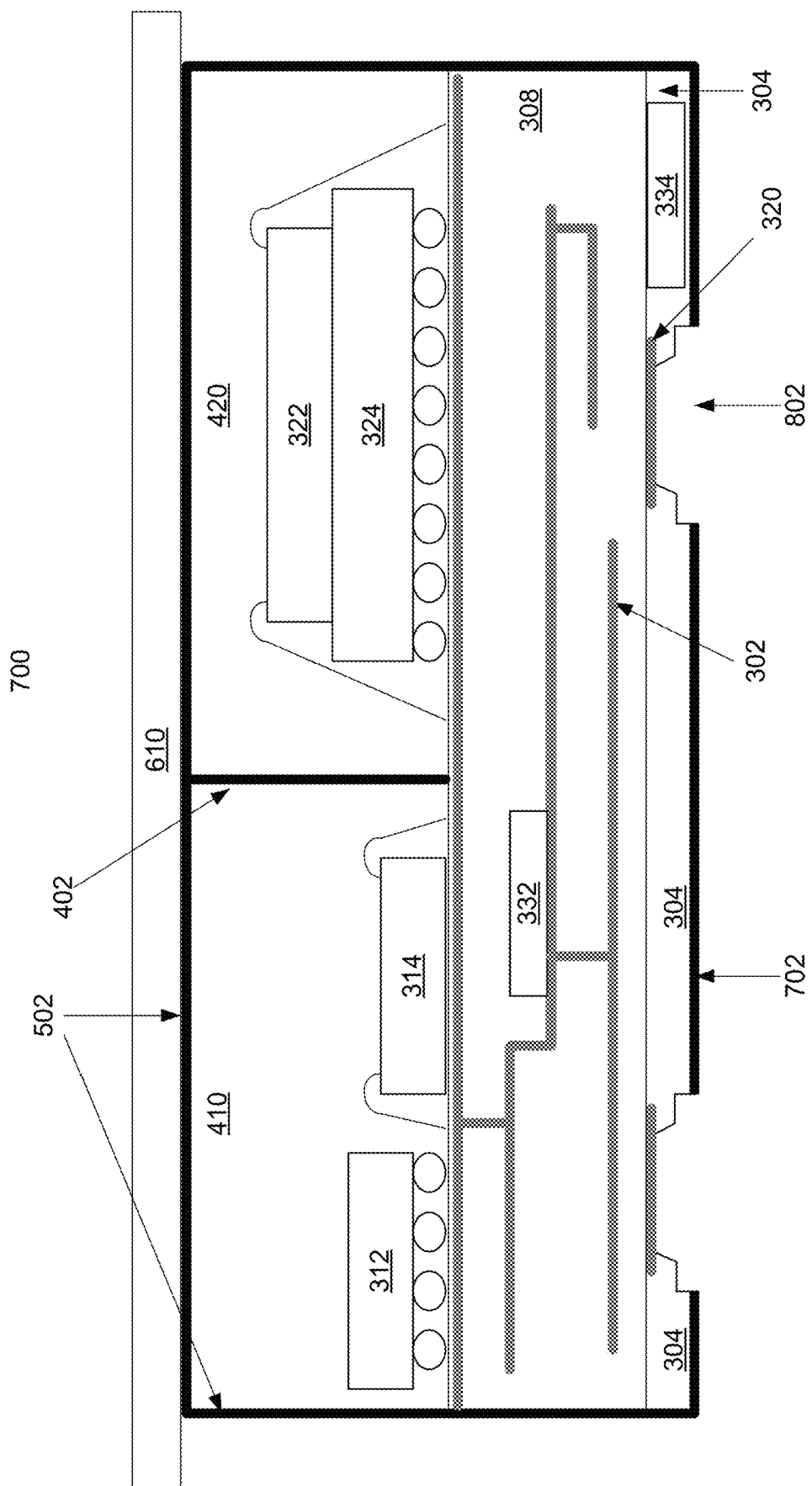

At 1012, the semiconductor package 700 of FIG. 8A may have portions of the EMI shielding material 702 and the encapsulant 304 removed to form openings 802 that provide access to pads 320. The EMI shielding material 702 may be removed by any of various suitable methods such as mechanical ablation, chemical etching, laser ablation, utilizing a jet of fluid or gas, etc. Once the encapsulant 304 is exposed, the process for exposing the pads 320 may be any method suitable. For example, portions of the encapsulant 304 may be removed using a suitable process such as, for example, laser ablation, although other processes such as chemical ablation, mechanical ablation, using a jet of fluid or gas for ablation of portions of the encapsulant 304, etc. may be used if suitable.

Figures 8B, 8C, 8D:
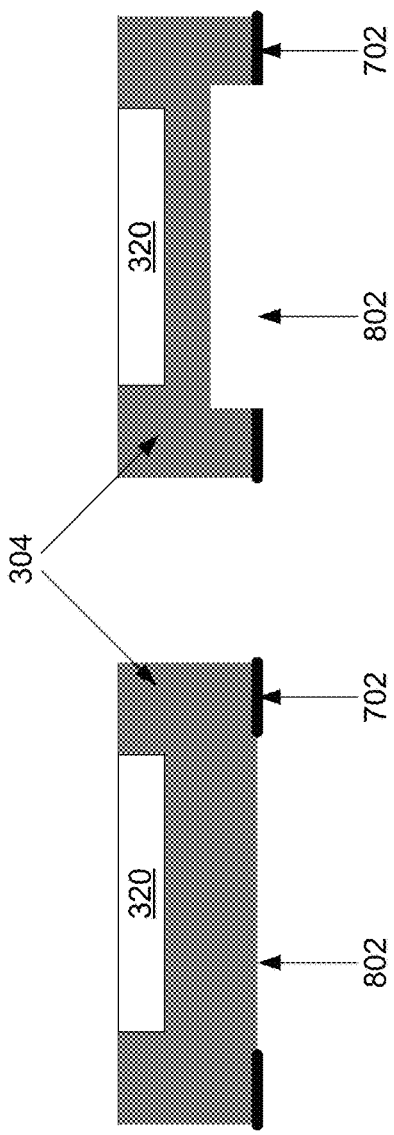

The ablation process may be a single step or multi-step process. For example, a two step ablation process is shown in FIGS. 8B to 8D. In the first step shown in FIGS. 8B and 8C, for example, a laser (or other material removal technique) may be used to remove the EMI shielding material 702 to start the opening 802, and the laser may be further used to remove a first desired portion of the encapsulant material 304 to form a first depression (or first portion of the opening 802). Then, in a second step shown in FIG. 8D, the laser (or other material removal technique) may be used to form a second depression (or second portion of the opening 802) to expose the pads 320. The second depression may be, for example, narrower than the first depression, but this need not be the case. Each of the respective depressions (or opening portions) may have respective vertical or sloped sides. As shown in FIG. 8D, in an example implementation in which the second depression is narrower than the first depression, there may be a shelf at the boundary of the first and second depressions. Such a shelf may, for example, provide a buffer space between an electrical connector (to be attached to the pad 320 later) and the external bottom shield 702.

Another process may be a three step process, for example, comprising first removing the EMI shielding material 702, then performing the first stage removal of the encapsulant material 304, then performing the second stage removal of the encapsulant material 304. Another process may allow, for example, multiple sweeps of the laser (or jets of gas or fluid) where the width of the depression is controlled for each sweep of the laser. Accordingly, various processes may be used to form different shapes of the opening 802 to expose the pads 320.

In yet another example implementation, a one step process may be utilized to form the opening 802. For example, a single laser ablation (or other material removal) step may be performed to form the opening 802. In such an implementation, the opening 802 may have continuous side walls (e.g., vertical side walls, sloped side walls, etc.).

At 1014, the semiconductor package 700 of FIG. 9 may have electrical interconnects 902 attached to the pads 320. The electrical interconnects 902 may be any suitable interconnect such as, for example, a conductive balls or conductive pillars. The conductive balls or pillars may be made of any suitable material. For example, the electrical interconnect 902 may be solder ball that may be heated (for example, using a solder reflow process) to melt at least some of the solder ball to form a connection to the pad 320 when the melted solder cools. Also for example, the electrical interconnect 902 may comprise a copper pillar or post that is plated on the pad 320 through the opening 802. Any appropriate method may be used for attaching the electrical interconnects 902 to the pads 320. The method of attaching the electrical interconnects 902 may depend on the type of interconnect.

When the EMI shielding of the semiconductor package 700 is finished, the carrier 610 may be removed with an appropriate method, which may be similar to the method described with respect to the carrier 310. The semiconductor package 700 may then be ready for assembly as part of, for example, a printed circuit board.

Various other processes can be followed for shielding all six sides of a semiconductor device. For example, some embodiments may form the internal shield 402 and the external shield 502 at the same time. Other embodiments may form the external shield 502 on only a portion of the vertical side surfaces of the semiconductor device 300 along with the external shield 502 on a top surface of the semiconductor device 300. Then, in a later step, the remainder of the external shield 502 may be formed on the vertical side surfaces of the semiconductor device 300 along with forming the external bottom shield 702 on the bottom surface of the semiconductor device 300.

In such a process, there may be another step to smooth out any overlap there may be of the external shield 502 on the vertical side surfaces of the semiconductor package 700. The overlap may be, for example, from overlapping that may occur on a given area of the vertical side surfaces from when the external shield 502 is formed on the top surface of the semiconductor device 300, and from when the external bottom shield 702 is formed on the bottom surface of the semiconductor device 300. The smoothing step may also be used with other embodiments as needed.

Additionally, various embodiments may also backfill the opening with a filler material, molding material, insulating material, or any other appropriate material. Furthermore, the internal shield 402, the external shield 502, and/or the external bottom shield 702 may be optionally connected to, for example, a ground path/plane of the semiconductor package 700 or to an electrical interconnect(s) that can be connected to a ground path/plane of a device/PCB to which the semiconductor 700 is mounted.

For example, referring to FIG. 9, the grounding of the internal shield 402, the external shield 502, and/or the external bottom shield 702 may be made, for example, by electrically connecting the internal shield 402 to a ground portion of the conductive trace 302, or by electrically connecting the external shield 502 to the ground portion of the conductive traces 302 at the sides of the semiconductor package 700.

Figure 11:
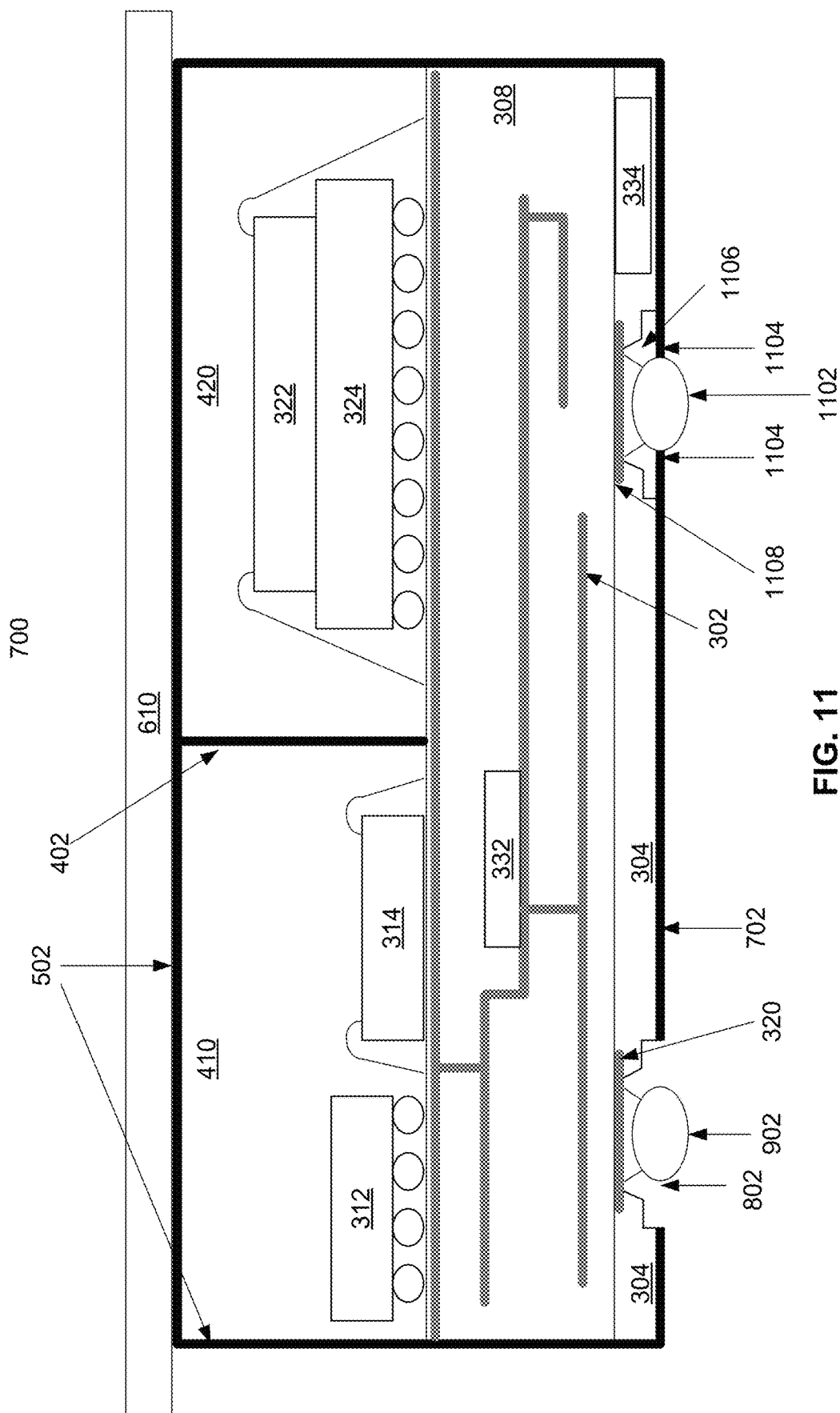
FIG. 11 is a cross-sectional view illustrating a semiconductor package according to an exemplary embodiment of the present disclosure.

FIG. 11 is a cross-sectional view illustrating a semiconductor package according to an embodiment of the present disclosure. Referring to FIG. 11, there is shown an embodiment where the internal shield 402, the external shield 502, and/or the external bottom shield 702 are electrically connected to a conductive interconnect 1102. In such cases, an electrical connection 1104 may be formed, for example, from the external bottom shield 702 to a conductive interconnect 1102. When such an electrical connection 1104 is made, the opening 802 into which the conductive interconnect 1102 was placed may be back filled to provide support for the electrical connection 1104 that will connect the external bottom shield 702 to the conductive interconnect 1102. The backfill 1106 may use any suitable material such as, for example, filler material, molding material, insulating material, and/or other appropriate material. The particular material used for backfilling may depend on, for example, the material that makes up the encapsulant 304. The pad 1108 may either be electrically isolated from other parts of the semiconductor package 700 or connected to ground trace/plane of the semiconductor package 700.

In another implementation, a first of the openings 802 (e.g., corresponding to a ground interconnect) may be formed to be narrower than others of the openings 802 (e.g., corresponding to general electronic signals). In such an implementation, when the interconnect is formed (e.g., solder reflowed), the interconnect may make electrical contact with the external bottom shield to provide a ground signal contact.

While a typical semiconductor device may have six sides, the disclosure also applies to a semiconductor device having a different number of sides. Additionally, the semiconductor device may have different number of semiconductor dies, different number of internal shields, different number of layers of semiconductor dies, etc. Additionally, while the various semiconductor devices/packages 200, 300, 700 are described as comprising semiconductor dies, it should be understood that a semiconductor device/package may comprise other semiconductor device(s)/package(s), semiconductor dies, passive devices, etc.

Additionally, while the electrical interconnects 902 are described as being electrically connected to the pads 320 that are covered by the encapsulant 304, various embodiments of the disclosure need not be so limited. For example, a pad 320 may be embedded in the encapsulant 304 with at least a bottom surface of the pad 320 exposed. However, it may be noted that if more than the bottom surface of the pad 320 is exposed from the encapsulant 304, then the exposed areas of the pad 320 may need to be insulated to protect from short circuiting to the external bottom shield 702 if an electrical connection between the external bottom shield 702 and the pad 320 is not desired. The insulation may be provided either during forming of the encapsulant 304 or by an additional step prior to forming the external bottom shield 702.

While the semiconductor package with EMI shield and the fabricating method thereof according to various aspects of the present disclosure have been described with reference to certain supporting embodiments, it will be understood by those skilled in the art that the present disclosure not be limited to the particular embodiments disclosed, but that the present disclosure will include all embodiments falling within the scope of the appended claims.

What is claimed is:

1. An apparatus, comprising:
a substrate comprising substrate conductive traces, a substrate top side, a substrate bottom side, and substrate sidewalls between the substrate top side and the substrate bottom side;
a first semiconductor device coupled to the substrate conductive traces;
a second semiconductor device coupled to the substrate conductive traces;
an upper encapsulant that encapsulates the first semiconductor device, the second semiconductor device, and a portion of the substrate top side;
a lower encapsulant that encapsulates a portion of the substrate bottom side;
an electromagnetic interference (EMI) shield that covers the upper encapsulant and the substrate sidewalls; and
an internal shield component comprising an internal shield component first lateral side and an internal shield component second lateral side that pass through the upper encapsulant and couple the EMI shield to a ground portion of the substrate conductive traces;
wherein the internal shield component second lateral side is opposite the internal shield component first lateral side; and
wherein the upper encapsulant contacts the internal shield component first lateral side and the internal shield component second lateral side.

2. The apparatus of claim 1, wherein the EMI shield covers a sidewall of the lower encapsulant.

3. The apparatus of claim 1, wherein the EMI shield conforms to outer surfaces of the upper encapsulant, the substrate, and the lower encapsulant.

4. The apparatus of claim 1, wherein the internal shield component extends through a vertical hole in the upper encapsulant.

5. The apparatus of claim 1, wherein:
the EMI shield comprises an EMI shield top portion that covers a top side of the upper encapsulant;
the internal shield component comprises an internal shield component upper end coupled to the EMI shield via the EMI shield top portion; and
the internal shield component comprises an internal shield component lower end coupled to the ground portion of the substrate conductive traces via the substrate top side.

6. The apparatus of claim 5, wherein the internal shield component first lateral side and the internal shield component second lateral side are between the internal shield component upper end and the internal shield component lower end.

7. The apparatus of claim 1, comprising:
interconnects that pass through the lower encapsulant;
wherein each of the interconnects comprises an upper end coupled to the substrate conductive traces via the substrate bottom side; and
wherein each of the interconnects comprises a lower end exposed at a bottom side of the lower encapsulant.

8. The apparatus of claim 1, comprising interconnects, wherein each of the interconnects comprises an upper end coupled to the substrate conductive traces via the substrate bottom side, and wherein each of the interconnects comprises a lower end exposed at a bottom side of the lower encapsulant.

9. The apparatus of claim 1, comprising:
interconnects coupled to the substrate conductive traces via the substrate bottom side;
wherein each of the interconnects comprises an upper portion laterally surrounded by the lower encapsulant; and
wherein each of the interconnects comprises a lower portion that extends beyond a bottom side of the lower encapsulant.

10. The apparatus of claim 1, comprising:
an electronic device coupled to the substrate bottom side; and
wherein the lower encapsulant laterally surrounds the electronic device.

11. The apparatus of claim 10, wherein the electronic device comprises a passive device.

12. An apparatus, comprising:
a substrate comprising a substrate first side, a substrate second side opposite the substrate first side, and substrate sidewalls between the substrate first side and the substrate second side;
a first semiconductor die comprising a first semiconductor die first side and a first semiconductor die second side opposite the first semiconductor die first side, wherein the first semiconductor die second side faces and is coupled to the substrate first side;
a second semiconductor die comprising a second semiconductor die first side and a second semiconductor die second side opposite the second semiconductor die first side, wherein the second semiconductor die second side faces and is coupled to the substrate first side;
a first encapsulant that encapsulates the first semiconductor die, the second semiconductor die, and a portion of the substrate first side;
a second encapsulant that encapsulates a portion of the substrate second side;
an electromagnetic interference (EMI) shield that covers the first encapsulant the substrate sidewalls, and a sidewall of the second encapsulant; and an internal shield component comprising an internal shield component first end coupled to the EMI shield, an internal shield component second end coupled to the substrate first side, an internal shield component first lateral side between the internal shield component first end and the internal shield component second end, and an internal shield component second lateral side opposite the internal shield component first lateral side and between the internal shield component first end and the internal shield component second end; and wherein the first encapsulant contacts the internal shield component first lateral side and the internal shield component second lateral side.

13. The apparatus of claim 12, wherein the internal shield component extends through a vertical hole between a first side of the first encapsulant and a second side of the first encapsulant.

14. The apparatus of claim 12, wherein:
the EMI shield comprises an EMI shield first portion that covers a first side of the first encapsulant; and
the internal shield component first end is coupled to the EMI shield via the EMI shield first portion.

15. The apparatus of claim 12, comprising interconnects, wherein:
each of the interconnects comprises a first end coupled to the substrate via the substrate second side; and
each of the interconnects comprises a second end exposed at a second side of the second encapsulant.

16. The apparatus of claim 12, comprising:
interconnects coupled to the substrate second side; and
wherein each of the interconnects comprises a first portion laterally surrounded by the second encapsulant; and
wherein each of the interconnects comprises a second portion that extends beyond a second side of the second encapsulant.

17. The apparatus of claim 12, comprising:
an electronic device coupled to the substrate second side; and
wherein the second encapsulant laterally surrounds the electronic device.

18. The apparatus of claim 17, wherein the electronic device comprises a passive device.

19. A method, comprising:
providing a substrate comprising a substrate first side, a substrate second side opposite the substrate first side, and substrate sidewalls between the substrate first side and the substrate second side;
providing a first semiconductor die comprising a first semiconductor die first side and a first semiconductor die second side opposite the first semiconductor die first side, wherein the first semiconductor die second side faces and is coupled to the substrate first side;
providing a second semiconductor die comprising a second semiconductor die first side and a second semiconductor die second side opposite the second semiconductor die first side, wherein the second semiconductor die second side faces and is coupled to the substrate first side;
providing an internal shield component comprising an internal shield component first end, an internal shield component second end coupled to the substrate first side, an internal shield component first lateral side between the internal shield component first end and the internal shield component second end, and an internal shield component second lateral side opposite the internal shield component first lateral side and between the internal shield component first end and the internal shield component second end; and
providing a first encapsulant that encapsulates the first semiconductor die, the second semiconductor die, and a portion of the substrate first side and contacts the internal shield component first lateral side and the internal shield component second lateral side;
providing a second encapsulant that encapsulates a portion of the substrate second side; and
providing an electromagnetic interference (EMI) shield that covers the first encapsulant, the substrate sidewalls, and a sidewall of the second encapsulant and is coupled to the internal shield component first end.

20. The method of claim 19, wherein providing the EMI shield comprises conforming the EMI shield to exposed surfaces of the first encapsulant, the substrate, and the second encapsulant.

* * * * *